(12) United States Patent
Kong

(10) Patent No.: US 8,618,558 B2
(45) Date of Patent: Dec. 31, 2013

(54) LIGHT EMITTING DEVICE PACKAGE AND LIGHT EMITTING APPARATUS

(75) Inventor: Sung Min Kong, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 440 days.

(21) Appl. No.: 12/559,814

(22) Filed: Sep. 15, 2009

(65) Prior Publication Data

US 2010/0096644 A1    Apr. 22, 2010

(30) Foreign Application Priority Data

Oct. 16, 2008 (KR) .................. 10-2008-0101641

(51) Int. Cl.
*H01L 27/15* (2006.01)

(52) U.S. Cl.
USPC ............ 257/79; 257/E33.055; 257/E23.46; 362/489; 362/519

(58) Field of Classification Search
USPC .............. 257/79, E33.055, E23.046; 362/489–514
See application file for complete search history.

(56) References Cited

U.S. PATENT DOCUMENTS

| | | | |
|---|---|---|---|
| 6,087,713 A * | 7/2000 | Haruta | 257/666 |
| 6,257,746 B1 * | 7/2001 | Todd et al. | 362/494 |
| 6,469,322 B1 * | 10/2002 | Srivastava et al. | 257/89 |
| 2003/0168583 A1 | 9/2003 | Kawabe et al. | |
| 2007/0153526 A1 * | 7/2007 | Lim | 362/294 |
| 2007/0262332 A1 | 11/2007 | Kong | |

FOREIGN PATENT DOCUMENTS

| | | |
|---|---|---|
| CN | 101022143 A | 8/2007 |
| JP | 01-041907 U | 3/1989 |
| JP | 06-060157 U | 8/1994 |
| JP | 09-283805 A | 10/1997 |
| JP | 2000-091647 A | 3/2000 |
| JP | 2001-053294 A | 2/2001 |
| JP | 2002-270902 A | 9/2002 |
| JP | 2003-264299 A | 9/2003 |
| JP | 2005-056657 A | 3/2005 |
| JP | 2005-128236 A | 5/2005 |
| JP | 2006-093359 A | 4/2006 |
| KR | 10-2005-0029384 A | 3/2005 |
| KR | 10-2005-0096322 A | 10/2005 |

OTHER PUBLICATIONS

Office Action dated Sep. 18, 2012 in Chinese Application No. 200980110795.9, filed Sep. 15, 2009.
Office Action dated Oct. 22, 2013 in Japanese Application No. 2011-532010, filed Sep. 15, 2009.

* cited by examiner

*Primary Examiner* — Dale E Page
(74) *Attorney, Agent, or Firm* — Saliwanchik Lloyd & Eisenschenk

(57) ABSTRACT

Disclosed are a light emitting device package and a light emitting apparatus. The light emitting device package comprises a package body comprising a light emitting surface inclined at an oblique angle with respect to a bottom surface, a plurality of lead electrodes in the package body, and at least one light emitting device electrically connected to the lead electrodes.

20 Claims, 5 Drawing Sheets

LIGHT EMITTING DEVICE PACKAGE AND LIGHT EMITTING APPARATUS

CROSS-REFERENCE TO RELATED APPLICATION

This application claims the benefit under 35 U.S.C. §119 of Korean Patent Application No. 10-2008-0101641, filed Oct. 16, 2008, which is hereby incorporated by reference in its entirety.

BACKGROUND

The present disclosure relates to a light emitting device package and a light emitting apparatus.

Light emitting diodes (LEDs) can form light sources using GaAs-based, AlGaAs-based, GaN-based, InGaN-based, and InGaAlP-based compound semiconductor materials.

Such an LED is packaged so as to be used as a light emitting device that emits light having various colors. The light emitting device has been used in various fields such as a lighting indicator, a character indicator, and an image displayer.

BRIEF SUMMARY

An embodiment provides a light emitting device package capable of emitting light at an oblique angle.

An embodiment provides a light emitting device comprising a light emitting device package capable of emitting light at an oblique angle.

An embodiment provides a light emitting device in which light emitting device packages capable of emitting light at an oblique angle are arrayed in at least one of the left, right, up, and down directions.

An embodiment provides a light emitting device in which a plurality of light emitting device packages capable of emitting light at an oblique angle are arrayed in the same direction and/or different directions.

An embodiment provides a light emitting device package comprising: a package body comprising a light emitting surface inclined at an oblique angle with respect to a bottom surface, a plurality of lead electrodes in the package body, and at least one light emitting device electrically connected to the lead electrodes.

An embodiment provides a light emitting apparatus comprising: a board comprising an interconnection pattern, and a plurality of light emitting device packages comprising a light emitting surface inclined at an oblique angle with respect to a top surface of the board.

An embodiment provides a light emitting device package comprising: a package body comprising a light emitting part comprising a cavity inclined at an oblique angle and a support part supporting the light emitting part at the oblique angle, a plurality of lead electrodes in the cavity, a light emitting device in the cavity, and a resin member in the cavity.

The details of one or more embodiments are set forth in the accompanying drawings and the description below. Other features will be apparent from the description and drawings, and from the claims.

DETAILED DESCRIPTION

Hereinafter, embodiments will be described in detail with respect to accompanying drawings. The thickness of components is an example, and not limited to the thickness of components shown in the accompanying drawings.

Figure 1:
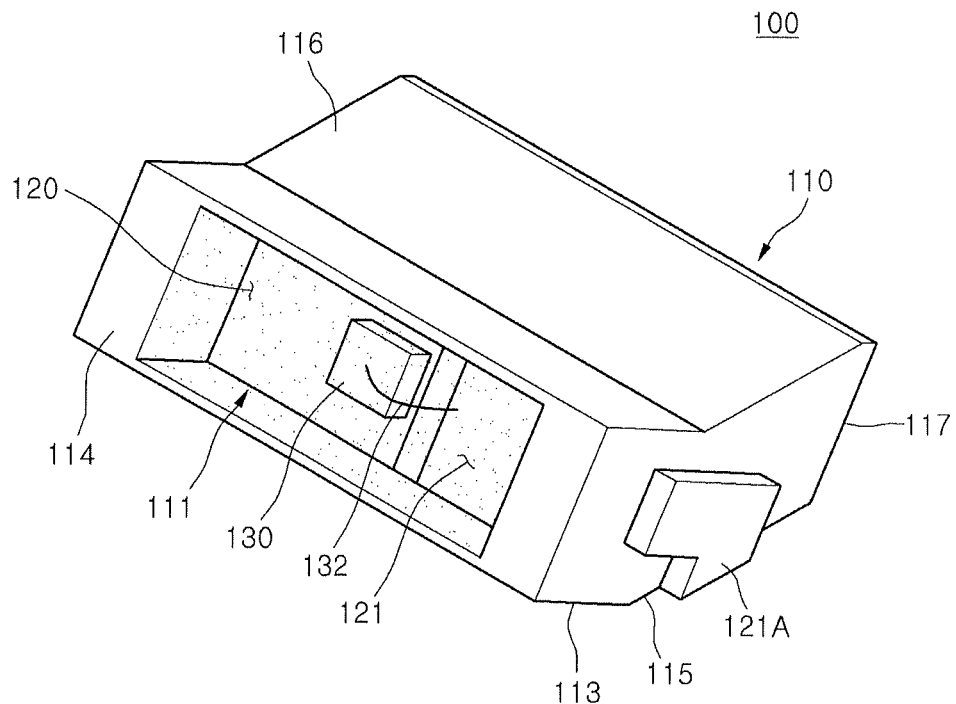
FIG. 1 is a perspective view showing a light emitting device package according to a first embodiment.
Figure 2:
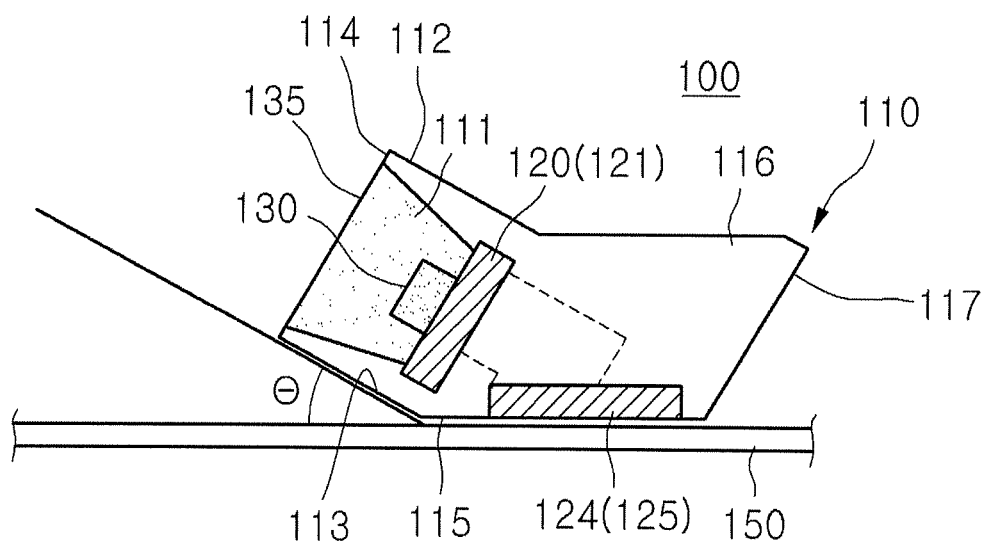
FIG. 2 is a sectional side view of FIG. 1.
Figure 3:
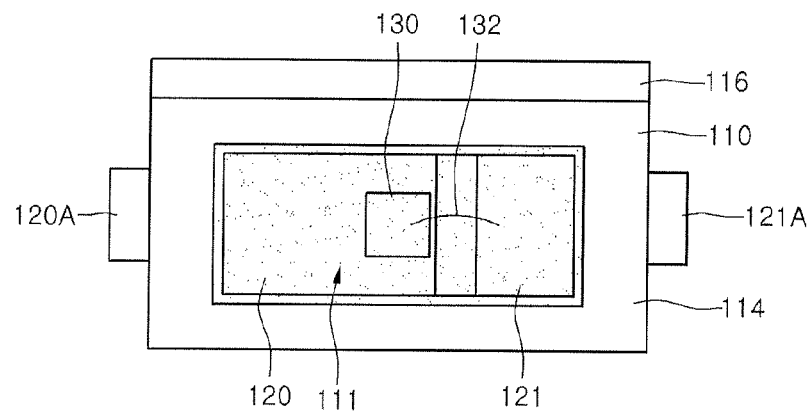
FIG. 3 is a front view showing a body of the light emitting device package of FIG. 1.
Figure 4:
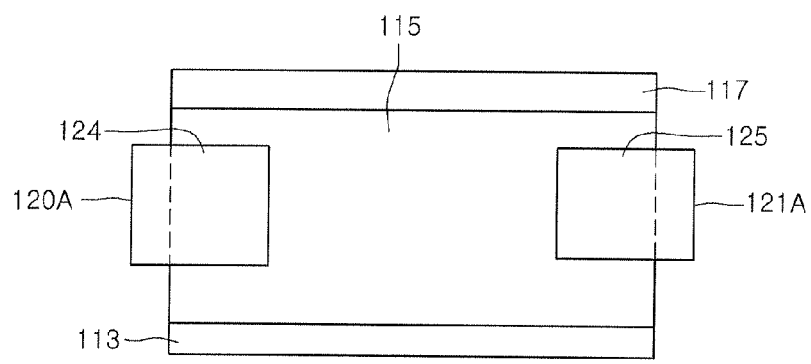
FIG. 4 is a bottom view showing the body of the light emitting device package of FIG. 1.

FIG. 1 is a perspective view showing a light emitting device package according to a first embodiment, and FIG. 2 is a sectional side view of FIG. 1. FIG. 3 is a front view of FIG. 1, and FIG. 4 is a bottom view of FIG. 1.

Referring to FIGS. 1 to 4, the light emitting device package 100 comprises a package body 110 having a light emitting part 114 formed at an oblique angle, lead electrodes 120 and 121, a light emitting device 130, and a resin member 135.

The package body 110 may be injection-molded by using plastic resin. The plastic resin may comprise at least one of polyphthal amide (PPA), polyphenylene sulfide (PPS), polyacryl amide (PAA), and polyether ether ketone (PEEK). The package body 110 can be integrally formed with the lead electrodes 120 and 121 through the injection-molding process. That is, after placing the lead electrodes 120 and 121 in a mold, the plastic resin is poured into the mold, thereby forming the package body 110.

The package body 110 comprises the light emitting part 114 and a support part 116. The light emitting part 114 has a light emitting surface formed at an oblique angle with respect to the support part 116. The support part 116 is supported at a rear portion of the light emitting part 114, and a bottom surface 115 of the support part 116 has a flat-surface shape.

A lower side surface 113 of the light emitting part 114 may be inclined at an oblique angle $\theta$ with respect to the bottom surface 115 of the support part 116. The oblique angle $\theta$ has a range of about 10° to about 80°.

The bottom surface 115 of the support part 116 of the package body 110 is mounted on a board 150, and the light emitting part 114 of the package body 110 is provided at an oblique angle with respect to the board 150.

The light emitting part 114 of the package body 110 has a structure in which an upper side surface 112 is parallel to the lower side surface 113, but the structure may be modified.

A rear surface 117 of the support part 116 may be perpendicular to the bottom surface 115 or inclined with respect to the bottom surface 115. The rear surface 117 of the support part 116 protrudes rearward, and such a protrusion structure allows the package body 110 to be balanced when the package body 110 is installed on a planar surface.

The package body 110 is featured in that the light emitting surface thereof is inclined at an oblique angle. Side surfaces of the package body 110 may be flat, or parallel to their opposite surfaces. In addition, the package body 110 may be bent at a predetermined angle, but the embodiment is not limited thereto.

The support part 116 of the package body 110 is provided therein with a cavity 111 having a predetermined depth. The cavity 111 may have a polygonal surface shape, but this shape may be varied according to molding shapes. The cavity 111 can be omitted. The embodiment employs the cavity structure for adjusting the amount of emitted light.

The cavity 111 is formed in the light emitting part 114, and realized as an opening formed at an oblique angle with respect to the bottom surface 115 of the support part 116. An inner wall of the cavity 111 may be perpendicular to the bottom surface 115 or inclined at a predetermined angle with respect to the bottom surface 115.

The cavity 111 is provided therein with at least one of the lead electrodes 120 and 121. The lead electrodes 120 and 121 may be formed by using a lead frame, a metallic layer, or a via structure. According to an embodiment, the lead frame type will be representatively described below.

First ends of the lead electrodes 120 and 121 are provided in the cavity 111 and second ends 120A and 121A of the lead electrodes 120 and 121 protrude through both sides of the package body 110, respectively. In addition, the second ends 120A and 121A of the lead electrodes 120 and 121 are disposed and formed with the bottom surface 115 of the support part 116. Referring to FIGS. 2 and 4, electrodes 124 and 125 provided on the bottom surface 115 of the support part 116 are external electrodes, and bonded with the board 150.

The lead electrodes 120 and 121 may be subject to a trimming process and/or a forming process for electrical connection with the board 150, and various trimming or forming processes may be performed.

The lead electrodes 120 and 121 may be attached to the light emitting device 130, and the light emitting device 130 may be connected to the lead electrode 121 through a wire 132.

The light emitting device 130 may be mounted on the lead electrodes 120 and 121 through a flip scheme. The light emitting device 130 may be attached to the lead electrodes 120 and 121 by using a conductive adhesive. The light emitting device 130 may be mounted on the lead electrodes 120 and 121 by using at least one wire. Such a connection scheme may be varied depending on a chip type and a mounting scheme.

The light emitting device 130 is provided in the form of a chip. The light emitting device 130 is inclined at an oblique angle with respect to a mounting surface of the package body 110.

The light emitting device 130 may comprise color LED chips such as a blue LED chip, a green LED chip, and a red LED chip or a ultraviolet (UV) LED chip. According to an embodiment, a blue LED chip may be representatively described below.

At least one light emitting device 130 may be provided in the cavity 111. When a plurality of LED chips are mounted on the lead electrodes 120 and 121, the pattern of the lead electrodes 120 and 121 may be changed.

The resin member 135 is formed in the cavity 111, and the resin member 135 comprises silicon or epoxy. When the light emitting device 130 comprises a blue LED chip, a phosphor emitting a yellow light can be added. When the light emitting device 130 comprises a UV LED chip, the light emitting device 130 may comprise green, red, and blue phosphors. LED chips and phosphors in the cavity 111 may be variously employed according to a target light of the light emitting device package 100, but the embodiment is not limited thereto.

In the light emitting device package 100, the light emitting surface of the light emitting part 114 of the package body 110 is provided at an oblique angle with respect to the bottom surface 115 of the support part 116. The light emitting surface of the light emitting part 114 is formed at an oblique angle θ+90° with respect to the bottom surface 115 of the support part 116. Therefore, lights can be emitted from the cavity 111 at an oblique angle. Accordingly, the light emitting device package 100 emits light through the light emitting surface of the package body 110 at an oblique angle direction.

The light emitting device package 100 emits light at an oblique angle direction with respect to the bottom surface 115.

The light emitting device package 100, which serves as a light source emitting light at an oblique angle, is applicable to a direct-type light unit or a side-type light unit. In addition, the light emitting device package 100 may be used with a top view-type package and/or a side-view package in the light unit.

Since the light emitting device package 100 can be formed thinner than an existing direct-type package, the light emitting device package 100 is applicable to a slim-type light unit.

Figure 5:
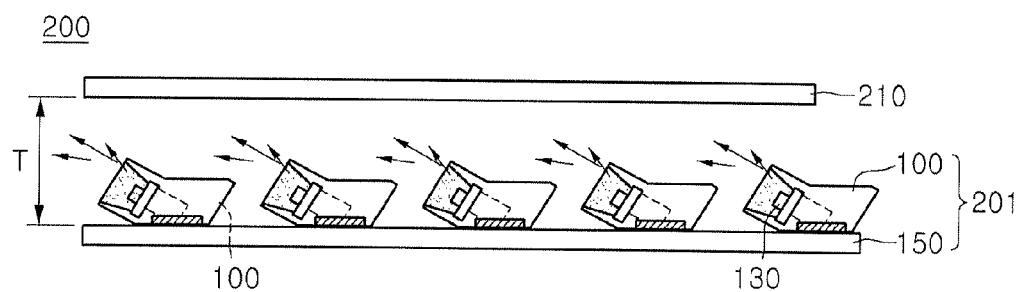
FIG. 5 is a sectional side view showing a light emitting device according to a second embodiment.
Figure 6:
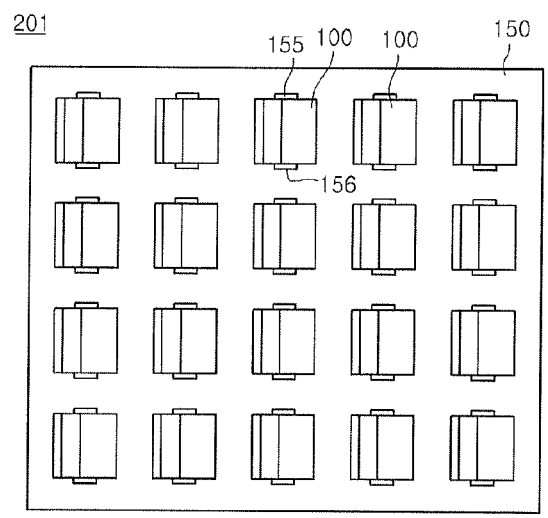
FIG. 6 is a plan view showing a light emitting module of FIG. 5.

FIG. 5 is a sectional side view showing a light emitting apparatus according to a second embodiment, and FIG. 6 is a plan view showing a light emitting module of FIG. 5.

Referring to FIGS. 5 and 6, the light emitting apparatus 200 comprises a light emitting module 201 and an optical sheet 210.

The light emitting module 201 comprises the board 150 and a plurality of light emitting device packages 100.

After forming interconnection patterns 155 and 156 on the board 150, the light emitting device package 100 is mounted on the interconnection patterns 155 and 156.

The light emitting device packages 100 are arrayed on the board 150 in a first direction and/or a second direction in at least one line. The light emitting device packages 100 may be arrayed with a constant or random interval.

The light emitting device packages 100 may be arrayed in the same direction, directions opposite to each other, or directions perpendicular to each other. The light emitting device packages 100 may be tilted at a predetermined angle. Such an array direction of the light emitting device packages 100 may be changed for the purpose of light efficiency and light distribution.

The light emitting device packages 100 may emit lights at the same light emitting angle or different light emitting angles, in which the light emitting angle is within the range of the oblique angle θ (see FIG. 2). In addition, the light emitting angles of the light emitting device packages 100 may be adjusted in a group unit or in a line unit of the light emitting device packages 100 within the range of the oblique angle.

The light emitting angles of the light emitting device packages 100 between the center portion and the side portion of the board 150 (i.e., the oblique angle θ within the range of 10° to 80°, see FIG. 2) may be the same or different from each other. For example, the oblique angle θ may be increased or decreased from the center portion of the board 150 to the side portion of the board 150.

The light emitting device packages 100 can improve light distribution and light intensity in the board 150 due to characteristics of emitting light at an oblique angle.

The optical sheet 210 comprises a prism sheet, and the prism sheet may comprise a horizontal prism sheet and/or a vertical prism sheet. The optical sheet 210 may comprise a brightness enhancement film. Such an optical sheet may be removed, but the embodiment is not limited thereto.

A display panel (not shown) such as an LCD panel may be provided above the optical sheet 210. The light emitting device 200 is used as a backlight unit. In addition, the light emitting device 200 may be provided in a housing. Such components may be added or removed within the scope of the embodiment.

The light emitting device packages 100 are arrayed in a first direction to irradiate light at an oblique angle, so that uniform light distribution can be achieved. Accordingly, a hot spot can be removed. The light emitting device 200 can inhibit the hot spot from occurring according to the thickness of the light emitting device package 100 and the light emitting direction of the light emitting device package 100. In addition, the light emitting device 200 can reduce a distance from the display panel. The light emitting device 200 having such a structure can be provided as a slimmer light unit than that of an existing light unit, so that the light emitting device 200 can serve as a backlight unit for a notebook computer, a monitor, a terminal, and a TV.

Figure 7:
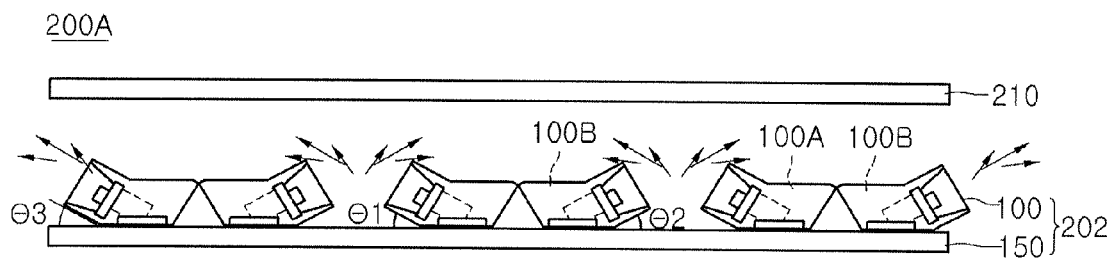
FIG. 7 is a sectional side view showing a light emitting module according to a third embodiment.
Figure 8:
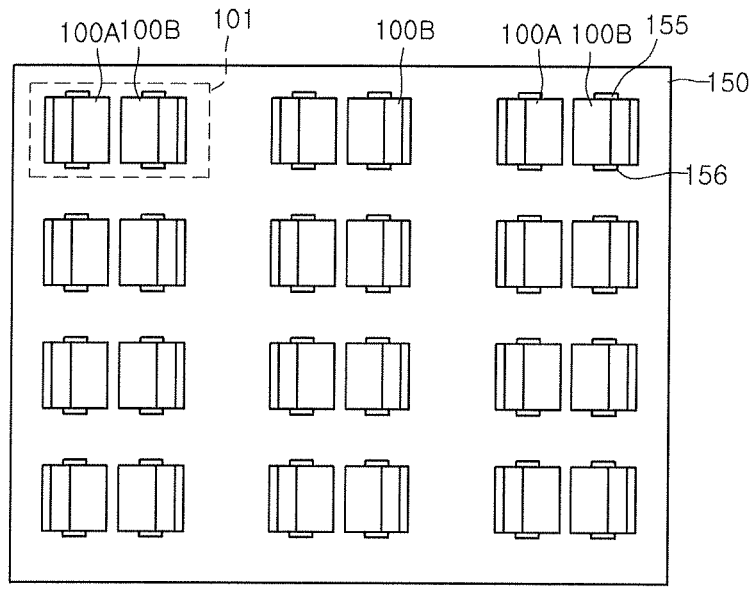
FIG. 8 is a plan view showing a light emitting module of FIG. 7.

FIG. 7 is a sectional side view showing a light emitting device 200A according to a third embodiment, and FIG. 8 is a plan view showing a light emitting module 202 of FIG. 7.

Referring to FIGS. 7 and 8, the light emitting module 202 of the light emitting device 200A has a structure in which a plurality of light emitting device packages 100A and 100B are arrayed according to groups 101.

The light emitting device packages 100A and 100B in one group 101 may be arrayed at an angle of 180° with respect to each other. The groups 101 may be arrayed uniformly or irregularly. Such an array of the groups 101 may be varied according to light distribution and light intensity.

In the light emitting module 202, the light emitting device packages 100A and 100B are arrayed at an angle of 180° with respect to each other in each group 101. The light emitting device packages 100A and 100B have the same light emitting angle ($\theta1=\theta2$) or different light emitting angles ($\theta1 \ne \theta2$), in which the light emitting angles $\theta1$ and $\theta2$ are within the range of the oblique angle.

The light emitting device packages 100 may represent the same light emitting angle ($\theta1=\theta3$). In addition, light emitting angles of the light emitting device packages 100 may gradually increase ($\theta1>\theta3$) or decrease ($\theta1<\theta3$) from the center portion of the board 120 to the side portion of the board 120. The light emitting angles $\theta1$ and $\theta3$ are in the range of 10° to 80°. Therefore, the light emitting characteristic of the light emitting device package 100 to emit light at the oblique angle can be used as much as possible.

Figure 9:
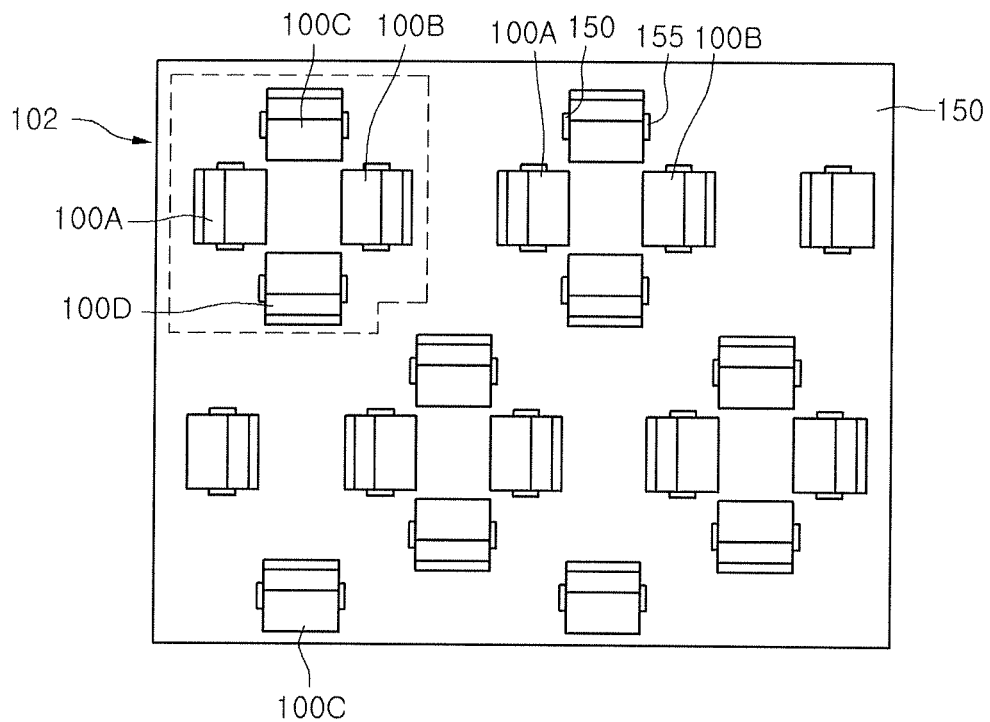
FIG. 9 is a plan view showing a light emitting device according to a fourth embodiment.

FIG. 9 is a plan view showing a light emitting device according to a fourth embodiment.

Referring to FIG. 9, a light emitting module 203 of a light emitting device has a structure in which four light emitting device packages 100A, 100B, 100C, and 100D are arrayed in the unit of one group 102.

The light emitting device packages 100A, 100B, 100C, and 100D are twisted at an angle of about 90° with respect to each other. In other words, the light emitting device packages 100A, 100B, 100C, and 100D may be arrayed in left, right, up, and down directions. The groups 102 of the light emitting device packages 100A, 100B, 100C, and 100D may be arrayed in a zigzag manner.

The light emitting device packages 100A, 100B, 100C, and 100D can emit light at the oblique angle in each position thereof. The light emitting device packages 100A, 100B, 100C, and 100D may have the same light emitting angle or different light emitting angles, in which the light emitting angles are within the range of the oblique angle.

The light emitting device packages 100A, 100B, 100C, and 100D may be arrayed at a predetermined angle within the range of about 360°.

Figure 10:
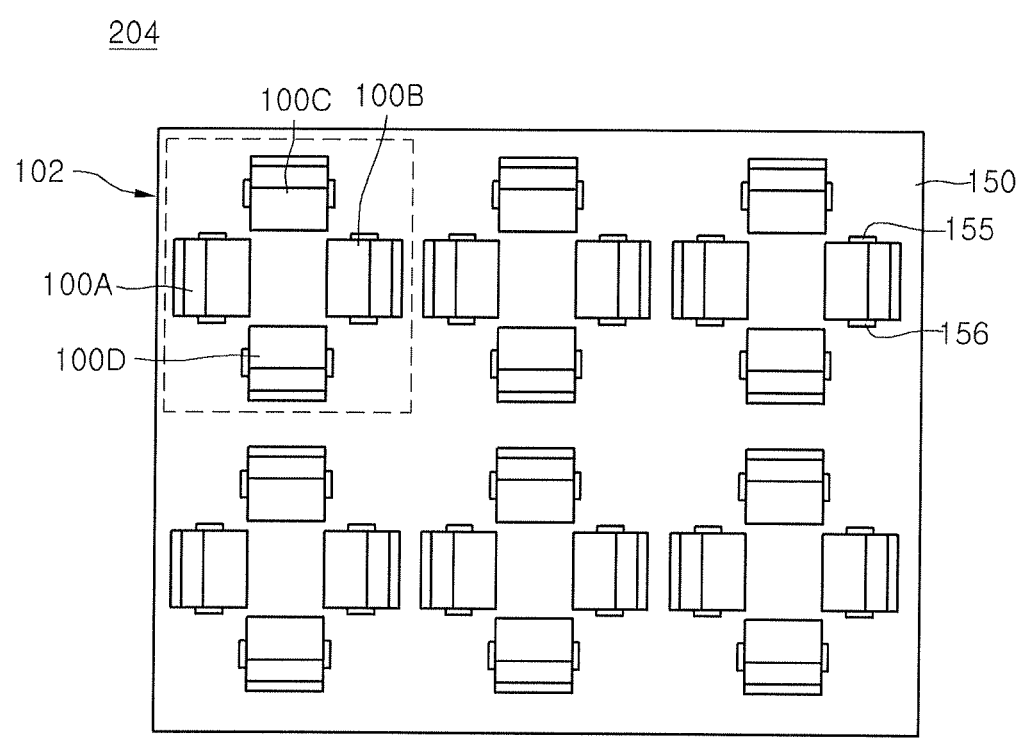
FIG. 10 is a plan view showing a light emitting device according to a fifth embodiment.

FIG. 10 is a plan view showing a light emitting device according to a fifth embodiment.

Referring to FIG. 10, a light emitting module 204 of a light emitting device has a structure in which four light emitting device packages 100A, 100B, 100C, and 100D are arrayed in the unit of one group 102.

The light emitting device packages 100A, 100B, 100C, and 100D are twisted at an angle of about 90° with respect to each other. In other words, the light emitting device packages 100A, 100B, 100C, and 100D may be arrayed in left, right, up, and down directions. The groups 102 of the light emitting device packages 100A, 100B, 100C, and 100D may be arrayed in the form of a matrix.

The light emitting device packages 100A, 100B, 100C, and 100D may be arrayed at a random angle or a constant angle in the range of about 360°.

The light emitting device packages 100A, 100B, 100C, and 100D of each group 102 can emit light at an oblique angle in each position thereof. The light emitting device packages 100A, 100B, 100C, and 100D may emit light at the same light emitting angle or different light emitting angles.

Although the second to the fifth embodiments have been described in that the light emitting device package emitting light at an oblique angle is applied to the direct-type light unit, the light emitting device package is applicable to the side-type light unit. The light emitting device package emitting light at an oblique angle is applicable to the light unit together with a typical direct-type package, but the embodiments are not limited thereto.

According to the embodiments, the light emitting modules 201, 202, 203, and 204 of the light emitting devices may comprise the light emitting device packages in order to inhibit hot spots and irregular brightness distribution.

An embodiment provides a method for manufacturing an light emitting device package, the method comprising: forming a package body comprising a light emitting part comprising a plurality of lead electrodes and a cavity inclined at an oblique angle; mounting an LED in the cavity; and forming a resin member in the cavity, wherein the package body comprises a front surface formed with the cavity and a bottom surface, the front surface being inclined with respect to the bottom surface at the oblique angle.

An embodiment can provide a light emitting device package capable of emitting light at an oblique angle.

An embodiment can inhibit a hot spot by employing a light emitting device package in a light unit.

An embodiment can inhibit a hot spot by using a light emitting device package capable of emitting light at an oblique angle.

An embodiment can maintain a uniform color distribution by using a light emitting device package capable of emitting light at an oblique angle.

An embodiment can improve the light quality of a light unit by employing a light emitting device package in some areas or the whole area of the light unit.

According to an embodiment, the LED package can be used as a light source in various fields such as indicators, street lamps, and illumination devices.

In the description, it will be understood that when a layer or film is referred to as being 'on' another layer or substrate, it may be directly on other layer or substrate, or intervening layers may also be present. Further, it will be understood that when a layer is referred to as being 'under' another layer, it may be directly under other layer, or one or more intervening layers may also be present. In addition, it will also be understood that when a layer is referred to as being 'between' two layers, it may be the only layer between the two layers, or one or more intervening layers may also be present.

According to an embodiment, the LED package can be reliably operated. Although the exemplary embodiments of the present invention have been described, it is understood that the present invention should not be limited to these exemplary embodiments but various changes and modifications can be made by one ordinarily skilled in the art within the spirit and scope of the present invention as hereinafter claimed.

Although embodiments have been described with reference to a number of illustrative embodiments thereof, it should be understood that numerous other modifications and embodiments may be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a package body comprising a light emitting part and a support part supporting the light emitting part, wherein a lower side surface of the light emitting part extends from a bottom surface of the support part such that the light emitting part is inclined at an oblique angle with respect to the bottom surface of the support part and wherein an end of the lower side surface of the light emitting part and an end of the bottom surface of the support part meet to form a joint edge;
   a plurality of lead electrodes in the package body; and
   at least one light emitting device electrically connected to the lead electrodes,
   wherein the light emitting part includes sidewalls forming a cavity, the light emitting device and the lead electrodes being disposed in an inner region of the cavity,
   wherein the light emitting part and the support part form a single body,
   wherein a rear surface of the support part is formed between an upper surface of the support part and the bottom surface of the support part, facing the light emitting part and extending rearward, and
   wherein the light emitting part protrudes in a direction opposite to the extension of the rear surface.

2. The light emitting device package of claim 1, wherein the lead electrodes and the light emitting device are inclined at the oblique angle with respect to the bottom surface of the support part.

3. The light emitting device package of claim 1, wherein a first end of each lead electrode is provided on the bottom surface of the support part through an outer portion of the package body.

4. The light emitting device package of claim 1, wherein the cavity has an inner wall which is perpendicular to a bottom surface of the cavity or outwardly inclined with respect to the bottom surface.

5. The light emitting device package of claim 1, wherein the light emitting part of the package body is inclined at an angle in a range of about 10° to about 80° with respect to the bottom surface of the support part.

6. The light emitting device package of claim 1, wherein the sidewalls are inclined at the oblique angle with respect to the bottom surface of the support part.

7. The light emitting device package of claim 1, wherein an upper portion of the rear surface of the support part of the package body protrudes.

8. The light emitting device package of claim 1, further comprising a transparent resin member or a transparent phosphor resin member in the cavity,
   and wherein the light emitting device comprises at least one of a color LED, which comprises blue, green and red LED chips, and an UV LED chip.

9. The light emitting device package of claim 1, wherein the package body comprises a plastic resin material, and each lead electrode comprises a lead frame.

10. The light emitting device package of claim 1, wherein the package body comprises one selected from the group consisting of polyphthal amide (PPA), polyphenylene sulfide (PPS), polyacryl amide (PAA), and polyether ether ketone (PEEK).

11. A light emitting apparatus comprising:
    a board comprising an interconnection pattern; and
    a plurality of light emitting device packages each light emitting device package comprising a light emitting part and a support part supporting the light emitting part, wherein a lower side surface of the light emitting part extends from a bottom surface of the support part such that the light emitting part is inclined at an oblique angle with respect to the bottom surface of the support part parallel to the board, and wherein the light emitting part includes sidewalls forming a cavity,
    wherein an end of the lower side surface of the light emitting part and an end of the bottom surface of the support part meet to form a joint edge,
    wherein the light emitting part and the support part form a single body,
    wherein a rear surface of the support part is formed between an upper surface of the support part and the bottom surface of the support part, facing the light emitting part and extending rearward, and
    wherein the light emitting part protrudes in a direction opposite to the extension of the rear surface.

12. The light emitting apparatus of claim 11, wherein the light emitting device packages are arrayed in an identical direction or different directions.

13. The light emitting apparatus of claim 11, wherein the light emitting device packages are twisted at a predetermined angle with respect to each other.

14. The light emitting apparatus of claim 11, wherein each light emitting device package further comprises:
    a plurality of lead electrodes in the cavity; and
    at least one light emitting device electrically connected to the lead electrodes, wherein the at least one light emitting device is disposed in an inner region of the cavity.

15. The light emitting apparatus of claim 11, wherein each light emitting device package has a light emitting angle gradually increased or decreased within the oblique angle from a central portion of the board to an outer portion thereof.

16. The light emitting apparatus of claim 11, wherein the light emitting device packages are arranged in groups, wherein the groups are arrayed in a predetermined direction or in a zigzag manner.

17. The light emitting apparatus of claim 11, further comprising an optical sheet on the board.

18. A light emitting device package comprising:
    a package body comprising a light emitting part and a support part supporting the light emitting part, wherein a lower side surface of the light emitting part extends from a bottom surface of the support part such that the light emitting part is inclined at an oblique angle with respect to the bottom surface of the support part and wherein an end of the lower side surface of the light emitting part and an end of the bottom surface of the support part meet to form a joint edge, wherein the light emitting part includes sidewalls forming a cavity;

a plurality of lead electrodes in the cavity;

a light emitting device in the cavity; and a resin member in the cavity, wherein the light emitting device is disposed in an inner region of the cavity, wherein the light emitting part and the support part form a single body, wherein a rear surface of the support part is formed between an upper surface of the support part and the bottom surface of the support part, facing the light emitting part and extending rearward, and wherein the light emitting part protrudes in a direction opposite to the extension of the rear surface.

19. The light emitting device package of claim 18, wherein the resin member comprises a phosphor, and the light emitting device comprises at least one of a color LED and an UV LED chip, the color LED comprising blue, green, and red LED chips.

20. The light emitting device package of claim 18, wherein the light emitting part of the package body is inclined at an angle in a range of about 10° to about 80° with respect to a bottom surface of the package body.

* * * * *